United States Patent
Mányoki

(10) Patent No.: US 6,514,780 B2
(45) Date of Patent: Feb. 4, 2003

(54) METHOD FOR MANUFACTURING AN INTEGRATED CIRCUIT HAVING A PARTICULAR FUNCTIONALITY REQUIRED BY A USER OF THE CIRCUIT AND HAVING FIRST STRUCTURES TO PRODUCE THE PARTICULAR FUNCTIONALITY AND SECOND STRUCTURES

(75) Inventor: Zoltán Mányoki, CDN-Kanata (CA)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/732,136

(22) Filed: Dec. 7, 2000

(65) Prior Publication Data

US 2001/0013658 A1 Aug. 16, 2001

(30) Foreign Application Priority Data

Dec. 7, 1999 (DE) .......................... 199 58 906

(51) Int. Cl.⁷ ............................................. H01L 21/66
(52) U.S. Cl. ....................... 438/18; 438/17; 438/401
(58) Field of Search ................. 438/401, 462, 438/975, 618, 622–624, 634, 636, 656, 683, 685, 687, 688, 494, 498, 504, 669, 671, FOR 142, 17, 18; 257/797

(56) References Cited

U.S. PATENT DOCUMENTS

| | | | | |
|---|---|---|---|---|
| 5,512,514 A | * | 4/1996 | Lee .............................. | 437/195 |
| 6,083,806 A | * | 7/2000 | Mancini et al. ............. | 438/401 |
| 6,143,622 A | * | 11/2000 | Yamamoto et al. ......... | 438/401 |
| 6,153,492 A | * | 11/2000 | Wege et al. ................. | 438/401 |
| 6,180,498 B1 | * | 1/2001 | Geffken et al. ............. | 438/462 |
| 6,218,262 B1 | * | 4/2001 | Kuroi et al. ................. | 438/401 |
| 6,323,527 B1 | * | 11/2001 | Iwamatsu et al. ........... | 257/409 |

* cited by examiner

Primary Examiner—Tom Thomas
Assistant Examiner—Douglas W. Owens
(74) Attorney, Agent, or Firm—Laurence A. Greenberg; Werner H. Stemer; Ralph E. Locher

(57) ABSTRACT

An integrated circuit has first structures that are produced in a plurality of wiring planes using exposure masks and serve for producing a functionality required by the user of the circuit. The circuit also has second structures that are produced in a plurality of the wiring planes using the exposure masks and do not serve for the particular functionality, but rather for the capability of checking if the exposure masks used belonged to a common mask set.

1 Claim, 2 Drawing Sheets

METHOD FOR MANUFACTURING AN INTEGRATED CIRCUIT HAVING A PARTICULAR FUNCTIONALITY REQUIRED BY A USER OF THE CIRCUIT AND HAVING FIRST STRUCTURES TO PRODUCE THE PARTICULAR FUNCTIONALITY AND SECOND STRUCTURES

BACKGROUND OF THE INVENTION

FIELD OF THE INVENTION

The invention relates to an integrated circuit and to an appropriate manufacturing method.

To manufacture integrated circuits, exposure masks are used to structure photosensitive layers. The structured photosensitive layers then serve, by way of example, as etching barriers or to produce defined doping profiles in layers situated underneath in the integrated circuit that is to be manufactured. Particularly when manufacturing complex integrated circuits, a large number of exposure masks are required. In this case, all the exposure masks used to manufacture a particular integrated circuit are referred to as a related mask set.

During manufacture, masks from the mask set which are to be used are mixed up with other masks not belonging to the mask set. This happens particularly if an improved version of an already existing circuit is to be produced, since the mask set for the new circuit then differs only slightly from the mask set for the old circuit, and the number of masks to be used is also the same. If one of the masks from the mask set which is to be used currently is mixed up with one of the masks from the other mask set, this results in malfunctions during operation of the manufactured circuit, these malfunctions being detectable only with difficulty when the circuit is tested or being difficult to attribute to their cause of fault, namely the use of an incorrect mask.

SUMMARY OF THE INVENTION

It is accordingly an object of the invention to provide an integrated circuit and a method for its manufacture which overcome the above-mentioned disadvantages of the prior art devices and methods of this general type, in which it possible to detect when masks used to manufacture the integrated circuits have been mixed up.

With the foregoing and other objects in view there is provided, in accordance with the invention, an integrated circuit containing a plurality of wiring planes. First structures are produced in the plurality of wiring planes using exposure masks. The first structures provide a particular functionality required by a user of the integrated circuit. Second structures are produced in the plurality of wiring planes using the exposure masks and do not serve for the particular functionality, but rather for checking if the exposure masks used belong to a common mask set.

According to the invention, in addition to the first structures that serve for producing a functionality required by the user of the circuit, the exposure masks are used to produce the second structures during the manufacture of the circuit. The second structures do not serve for the particular functionality of the circuit, but rather for the ability to check whether the exposure masks used belong to a common mask set. The second structures are disposed in a plurality of wiring planes in the integrated circuit. In this case, the first structures contain all the electrical structures ensuring the required functionality of the circuit. By way of example, the first structures may be parts of resistors, capacitors and/or transistors. By contrast, the second structures do not serve for the functionality required by the user of the circuit, but rather for checking whether the exposure masks used were the correct masks. Hence, the second structures serve the interests of the manufacturer of the integrated circuit, who is able to use the second structures to establish whether the manufactured circuit can actually work correctly because the correct exposure masks associated with the common mask set have been used.

In accordance with one embodiment of the invention, the second structures can be evaluated electrically, so that it is possible to establish whether the exposure masks used during manufacture were associated with the common mask set. Therefore, the second structures must be electrically conductive so that they can conduct measuring currents supplied to them, for example.

It is advantageous if the integrated circuit has an evaluation unit for evaluating the second structures and for producing a corresponding result signal. The result signal indicates whether the exposure masks used during manufacture belonged to the common mask set. Such an evaluation unit, which is integrated on the circuit, permits a self-test in the circuit to determine the correctness of the masks used during manufacture.

It is beneficial if the evaluation circuit uses the result signal to trigger a malfunction in the circuit if the exposure masks used for manufacture did not belong to the common mask set. The malfunction relates to the functionality which is required by the user of the circuit and which is ensured by the first structures. In this development of the invention, the evaluation circuit therefore intervenes in the functioning of the circuit that is performed by the first structures. If this particular malfunction occurs, the manufacturer of the circuit can then conclude that the evaluation unit has detected a fault in the masks used for manufacturing the circuit.

With the foregoing and other objects in view there is further provided, in accordance with the invention, a method for manufacturing the integrated circuit. The method includes providing a substrate having a plurality of wiring plane disposed therein. Exposure masks are used to produce first structures in the plurality of wiring planes. The first structures produce a particular functionality required by a user of the integrated circuit. The exposure masks are also used to produce second structures in the wiring planes. The second structures do not serve for the particular functionality, but rather for checking if the exposure masks used belonged to a common mask set.

Other features which are considered as characteristic for the invention are set forth in the appended claims.

Although the invention is illustrated and described herein as embodied in an integrated circuit and a method for its manufacture, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
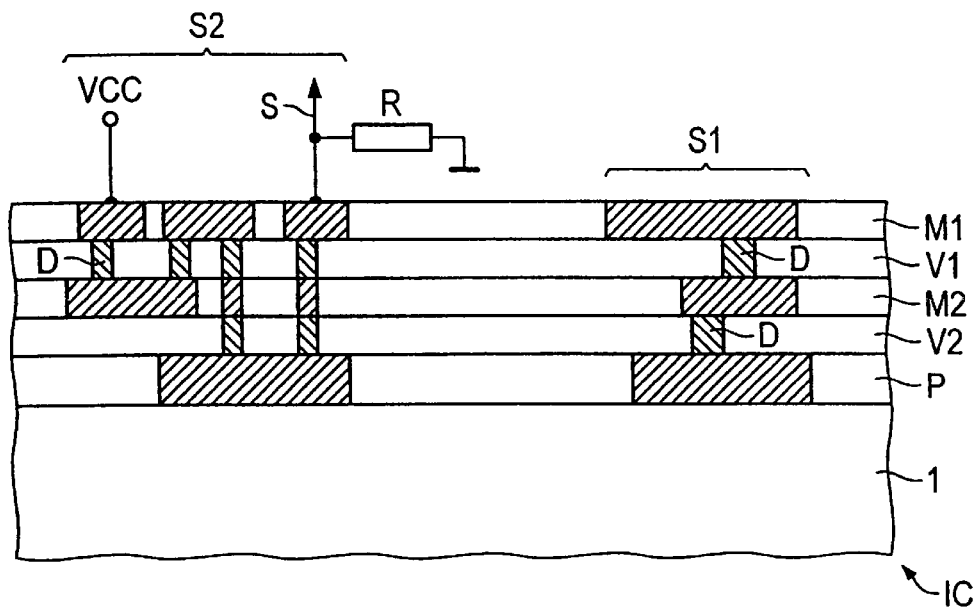
FIG. 1 is a diagrammatic, cross-sectional view of an integrated circuit according to the invention.

In all the figures of the drawing, sub-features and integral parts that correspond to one another bear the same reference symbol in each case. Referring now to the figures of the drawing in detail and first, particularly, to FIG. 1 thereof, there is shown a cross-sectional illustration of an integrated circuit IC having a plurality of wiring planes M1, M2, P on a substrate 1. The wiring planes are formed of a first metalization plane M1, a second metalization plane M2 and a polysilicon plane P. Disposed in the various wiring planes are first structures S1 and second structures S2, which are shaded in FIG. 1. The structures S1, S2 are electrically conductive. The unshaded areas in FIG. 1 are electrically insulating. Disposed between every two of the wiring planes M1, M2, P are insulating planes V1, V2 in which plated-through holes D have been produced which are likewise part of the first S1 and second structures S2 and via which the conductive structures disposed in the wiring planes M1, M2, P are connected to one another.

The first structures S1 together form an electric circuit that is used to produce the functionality required from the integrated circuit by the user. The electric circuit includes, by way of example, resistors, transistors, capacitors, etc. formed by the first structures S1.

The second structures S2 form a cohesive, electrically conductive signal path whose one end is connected to a positive supply potential VCC and whose other end is connected to ground via a resistor R. At a connection of the resistor R which is remote from ground, the signal path delivers a result signal S whose level depends on whether the signal path connects the supply potential VCC and the resistor R to one another continuously or whether it is interrupted. In the former case, the result signal S has the value of the supply potential VCC and in the latter case it is the same as ground. The resistor R is thus a pull-down resistor.

Figure 3:
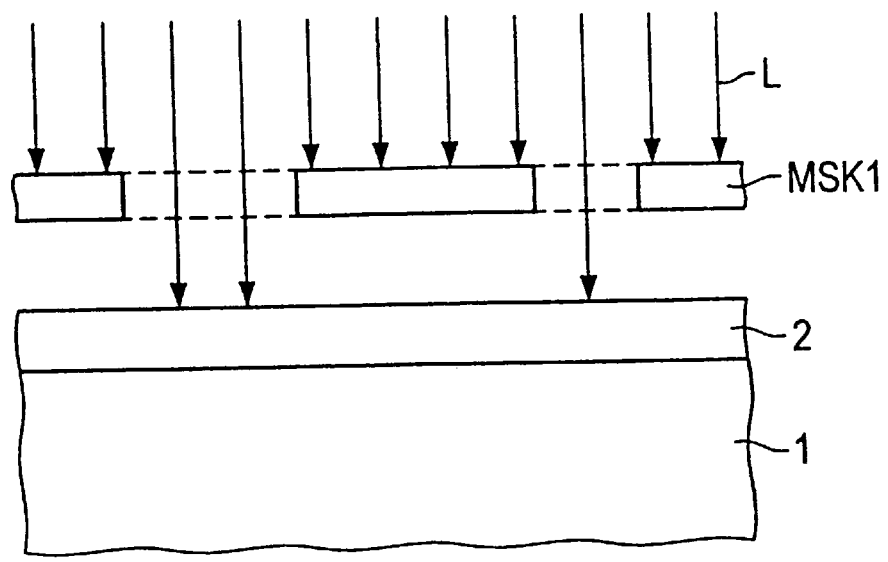
FIG. 3 is a sectional view showing a manufacturing step for producing the integrated circuit.

FIG. 3 shows that the individual first structures S1 and the second structures S2 from FIG. 1 are manufactured using an exposure mask MSK1. FIG. 3 shows, by way of example, only one of many manufacturing steps, this step using only the first mask MSK1. In this context, a photosensitive layer 2 is applied to the substrate 1 and is deliberately exposed using light L impinging through the first mask MSK1.

Figure 4:
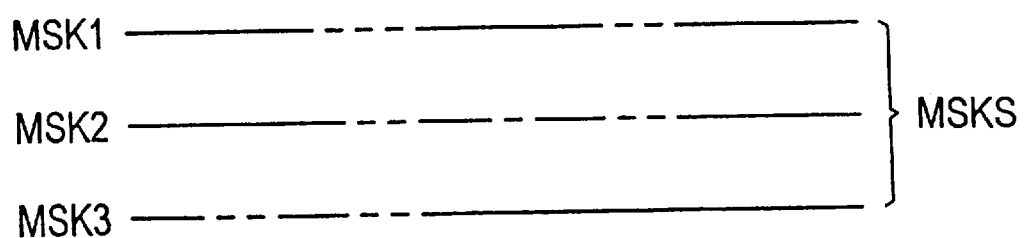
FIG. 4 is an illustration representing three masks which are associated with a common mask set and are used to manufacture the circuit.

FIG. 4 shows that all the masks required for manufacturing the integrated circuit, of which only three MSK1 to MSK3 have been shown in FIG. 4, are associated with a common mask set MSKS. If the masks MSKi are used in the correct order during manufacture, the structures S1, S2 shown in FIG. 1 are produced. The cohesive signal path which can be seen in FIG. 1 is then formed by the second structures S2 and the result signal S has the value of the supply potential VCC. If, by contrast, one or a plurality of the masks MSKi from the mask set MSKS are replaced by masks from another mask set, which is not intended for manufacturing this specific integrated circuit, a different reciprocal configuration of the second structures S2 is produced during manufacture. This results in that no cohesive signal path is produced and the result signal S is at the ground potential. However, this presupposes that each mask set MSKS intended for manufacturing a specific integrated circuit has its own associated "identification code". Therefore, the masks MSKi from each mask set MSKS must be different than those from other mask sets in terms of their configuration, so that the use of different mask sets MSKS results in different second structures S2 in each case, which correspond to the respective identification code of the mask set MSKS.

Figure 2:
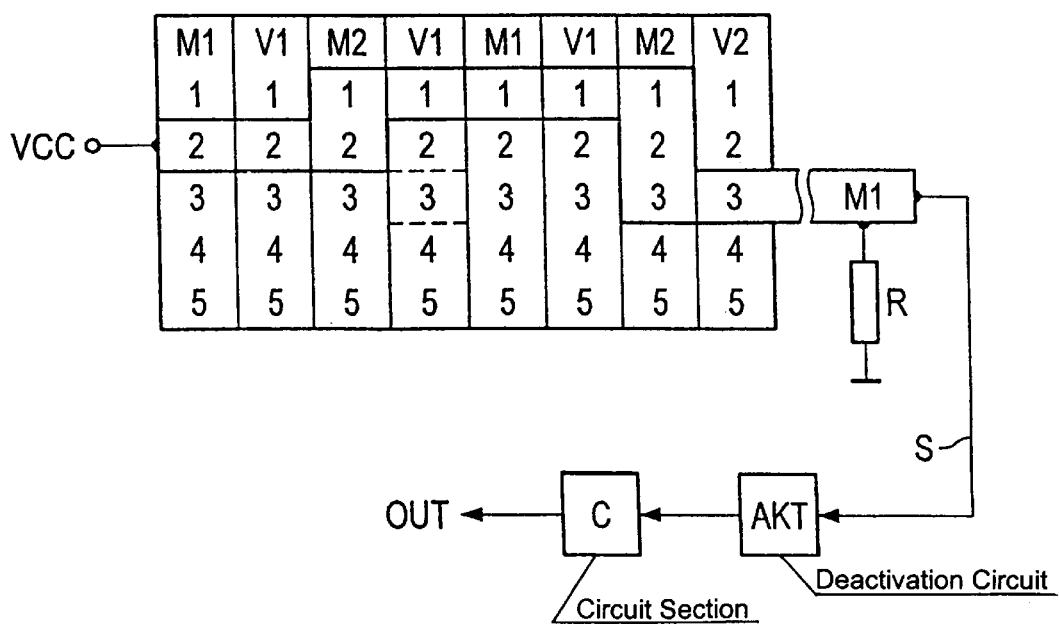
FIG. 2 is a chart showing the principle of evaluation of second structures in the circuit and also an evaluation unit in the circuit.

FIG. 2 will be used to explain once again what is meant by the above statements. FIG. 2 is a symbolic illustration, that is to say is not a cross-sectional illustration. It shows a detail of the signal path extending between the supply potential VCC and the resistor R in FIG. 1. The signal path, which is formed by the second structures S2 produced in the various planes M1, M2, P, V1, V2, is continuous, as shown in FIGS. 1 and 2, only if the second structures S2 are disposed appropriately with respect to one another. If, for example, the second structure S2, symbolized in the fourth column of the box shown in FIG. 2, in the first insulating plane V1 were not disposed in position 1, but in position 3 instead (indicated in dashes), a non-cohesive signal path would be produced, which results in that the result signal S would set at the ground level. Allocating individual identification codes to the different mask sets MSKS must ensure that a cohesive signal path is produced only if all the masks used belong to the same mask set MSKS.

FIG. 2 also shows that the integrated circuit IC has a circuit section C (produced by the first structures S1) which, when it is operating, delivers output signals to an output OUT of the integrated circuit. In addition, the integrated circuit has a deactivation circuit AKT which, when the result signal S has a low level (that is to say when there is no cohesive signal path between the supply potential VCC and the resistor R, i.e. at least one incorrect mask MSKi has been used during manufacture of the integrated circuit), affects the way in which the circuit section works such that a malfunction occurs in it. The result of the malfunction is that the circuit section C does not output the signals intended in normal operation to the output OUT, but instead signals which differ therefrom.

It can also, for example on account of the malfunction, simply switch the output OUT to a high impedance state if this is not intended in normal operation. In any case, the malfunction must be unambiguously recognizable from outside the integrated circuit and must be able to be associated with the fault that has occurred. When the malfunction occurs, it is then possible to infer from outside the integrated circuit IC that an error has occurred in the mask allocation during the manufacture of the circuit.

The invention does not just make it possible to detect whether only those exposure masks associated with the correct mask set MSKS were used during manufacture, but also whether the masks were used in the correct order in the individual manufacturing steps for the integrated circuit.

The invention can be used not only for electrical integrated circuits, but also for integrated circuits containing micromechanical components, for example.

I claim:

1. A method for manufacturing an integrated circuit, which comprises the steps of:

providing a substrate having a plurality of wiring planes disposed therein;

using exposure masks to produce first structures in the plurality of wiring planes, the first structures produce a particular functionality required by a user;

using the exposure masks to produce second structures in the plurality of the wiring planes, the second structures not serving for the particular functionality, but for checking if the exposure masks used belonged to a common mask set;

evaluating the second structures and producing a corresponding result signal; and checking the second structures to determine if all the exposure masks used during manufacture were associated with the common mask set.

* * * * *